(12) United States Patent
Takahara et al.

(10) Patent No.: US 9,524,893 B2
(45) Date of Patent: Dec. 20, 2016

(54) INACTIVE GAS INTRODUCING FACILITY AND INACTIVE GAS INTRODUCING METHOD

(71) Applicant: Daifuku Co., Ltd., Osaka-shi (JP)

(72) Inventors: Masahiro Takahara, Gamo-gun (JP); Toshihito Ueda, Gamo-gun (JP)

(73) Assignee: Daifuku Co., Ltd. (JP)

( * ) Notice: Subject to any disclaimer, the term of this patent is extended or adjusted under 35 U.S.C. 154(b) by 386 days.

(21) Appl. No.: 13/720,036

(22) Filed: Dec. 19, 2012

(65) Prior Publication Data

US 2014/0000757 A1    Jan. 2, 2014

(30) Foreign Application Priority Data

Dec. 22, 2011 (JP) ................................ 2011-281857

(51) Int. Cl.
*H01L 21/673* (2006.01)
*B65B 31/04* (2006.01)
*H01L 21/677* (2006.01)

(52) U.S. Cl.
CPC ......... *H01L 21/67393* (2013.01); *B65B 31/04* (2013.01); *H01L 21/67769* (2013.01)

(58) Field of Classification Search
CPC .. H01L 21/67; H01L 21/67011; H01L 21/673; H01L 21/67393; H01L 21/67769; B65B 31/04
USPC .................... 141/63, 65, 66, 349; 55/385.2; 206/710–712; 414/935–941
See application file for complete search history.

(56) References Cited

U.S. PATENT DOCUMENTS

| | | | | |
|---|---|---|---|---|
| 5,735,961 A | * | 4/1998 | Shimada ....................... | 118/724 |
| 5,879,458 A | * | 3/1999 | Roberson et al. ............ | 118/715 |
| 6,123,120 A | * | 9/2000 | Yotsumoto et al. ........... | 141/65 |
| 6,508,885 B1 | * | 1/2003 | Moslehi et al. .............. | 118/728 |
| 6,733,592 B2 | * | 5/2004 | Fujikawa et al. ............. | 118/715 |
| 7,232,286 B2 | * | 6/2007 | Shinozaki ..................... | 414/805 |
| 7,494,107 B2 | * | 2/2009 | Sheydayi et al. ............ | 251/63.5 |
| 7,585,686 B2 | * | 9/2009 | Verhaverbeke et al. ........ | 438/16 |
| 8,240,346 B2 | * | 8/2012 | Goto et al. ....................... | 141/65 |
| 8,469,650 B2 | * | 6/2013 | Lee et al. ...................... | 414/217 |
| 9,245,781 B2 | * | 1/2016 | Takahara ........... | H01L 21/67393 |
| 2001/0042439 A1 | | 11/2001 | Roberson, Jr. et al. | |

(Continued)

FOREIGN PATENT DOCUMENTS

| | | |
|---|---|---|
| JP | 11168135 A | 6/1999 |
| JP | 2005101261 A | 4/2005 |

(Continued)

*Primary Examiner* — Timothy L Maust
*Assistant Examiner* — Andrew StClair
(74) *Attorney, Agent, or Firm* — The Webb Law Firm (57) ABSTRACT

An inactive gas introducing facility includes an introducing device disposed in a support portion supporting a container accommodating a substrate and configured for introducing inactive gas to the inside of the container through a gas feed opening of the container with discharging gas present inside the container to the outside through a gas discharge opening of the container and a controller for controlling operation of the introducing device. The introducing device is capable of varying the feed rate of the inactive gas. The controller is configured to control the operation of the introducing device such that in the feeding of the inactive gas to the container supported to the support portion, the feed rate is increased progressively to a target feed rate.

16 Claims, 6 Drawing Sheets

(56) References Cited

U.S. PATENT DOCUMENTS

| | | | |
|---|---|---|---|
| 2005/0069420 A1* | 3/2005 | Miyajima | H01L 21/67017 417/53 |
| 2008/0156069 A1* | 7/2008 | Murata et al. | 73/19.04 |
| 2009/0176181 A1* | 7/2009 | Dudman | 432/24 |
| 2010/0000625 A1* | 1/2010 | Goto et al. | 141/4 |
| 2014/0014225 A1* | 1/2014 | Takahara et al. | 141/4 |

FOREIGN PATENT DOCUMENTS

| | | |
|---|---|---|
| JP | 2005340330 A | 12/2005 |
| JP | 200686308 A | 3/2006 |
| JP | 2006156769 A | 6/2006 |
| JP | 2007520895 A | 7/2007 |
| JP | 2008159734 A | 7/2008 |
| WO | 2005078771 A2 | 8/2005 |

\* cited by examiner

INACTIVE GAS INTRODUCING FACILITY AND INACTIVE GAS INTRODUCING METHOD

FIELD OF THE INVENTION

The present invention relates to an inactive gas introducing facility including an introducing device disposed in a support portion supporting a container accommodating a substrate (or substrates) and configured for introducing inactive gas to the inside of the container through a gas feed opening of the container with discharging gas present inside the container to the outside through a gas discharge opening of the container and a controller for controlling operation of the introducing device. The invention relates also to an inactive gas introducing method utilizing such inactive gas introducing facility.

BACKGROUND ART

The inactive gas introducing facility described above is used for e.g. introducing an amount of inactive gas into a container accommodating a substrate (such as a semiconductor wafer) for the purpose of restricting unwanted adhesion and accumulation of particles on the substrate thereby to avoid deterioration of the substrate from its proper state due to oxygen and/or humidity.

More particularly, in association with the introduction of inactive gas through the gas feed opening of the container accommodating the substrate, gas present inside the container will be discharged to the outside through a gas discharge opening of the container and the interior of the container will be filled with the introduced inactive gas eventually. Therefore, unwanted adhesion of particles on the substrate and deterioration of the substrate from its proper state due to oxygen and/or humidity are restricted.

Japanese Unexamined Patent Application Publication No. 2006-86308 (Patent Document 1) discloses an example of such inactive gas introducing facility. With this inactive gas introducing facility, nitrogen gas as an inactive gas is introduced at a target feed rate (10 liters/min.) into a pod as a container.

Incidentally, in Patent Document 1, at the gas feed opening, there is mounted a valve configured to allow introduction of nitrogen gas into the container at a pressure slightly higher than the atmospheric pressure. Whereas, at the gas discharge opening, there is mounted a valve configured to allow discharge of the gas inside the container at a pressure slightly higher than the atmospheric pressure.

According to the document, after introduction of nitrogen gas into the container for five minutes, the pod is kept therein with stopping further introduction.

That is, Patent Document 1 describes that at a location separate from a pod shelf storing the pod, there is provided a gas station supporting the pod for the introduction of nitrogen gas and the pod which has received the introduction of nitrogen gas at the gas station is stored on the pod shelf.

Japanese Unexamined Patent Application Publication No. 11-168135 (Patent Document 2) discloses another example of inactive gas introducing facility. With this inactive gas introducing facility, a pod as a container receives feeding of nitrogen gas as an inactive gas for a set feed period. Thereafter, during a set pause period, the feeding of nitrogen gas is paused. Upon lapse of the set pause period, the nitrogen gas is fed again for the set feed period. In this way, nitrogen gas is fed into the pod in an intermittent manner (see e.g. Patent Document 2: paragraphs [0101] through [0118]).

Incidentally, Patent Document 2 describes that nitrogen gas is introduced into the pod which is supported on a shelf of a storage device.

While the document provides no specific explanation regarding the target feed rate used in the feeding of nitrogen gas into the pod, the document describes that in the course of feeding nitrogen gas into the container, when a gas feed valve is opened, the nitrogen gas is fed at a predetermined feed rate as the target feed rate.

Meanwhile, Patent Document 2 also describes that rather than the intermittent feeding of nitrogen gas, the feeding of nitrogen gas into the pod can be carried out in a continuous manner.

With the inactive gas introducing facilities disclosed in Patent Document 1 and Patent Document 2, when inactive gas is fed into the container, the inactive gas is fed at one time at the target feed rate. That is, the feed rate of inactive gas to the container will increase instantaneously or in stepwise to the target feed rate. Therefore, at the time of start of introduction, there will occur vibration in the substrate present inside the container, which vibration leads to dropping off of solvent present on the back face of the substrate. Then, when this dropped solvent adheres to the front face of another substrate which may be present downwardly, the adhesion may invite deterioration of this further substrate from its proper state. Further, at the time of start of introduction, there may occur also floating of particles accumulated on the bottom of the container and these particles may adhere to the substrate.

Incidentally, as an example of the solvent, a developing solution for photoresist processing can be cited.

Incidentally, it is believed that such vibration of substrate and floating of particles inside the container are caused by the phenomenon that the pressure of the gas inside the container first increases sharply and then drops sharply.

That is, in association with the introduction of inactive gas into the container at the target feed rate, there occurs a change in the state of the gas present inside the container from the stationery state to the fluidized state. In this, since the gas inside the container cannot change speedily from the stationery state to the fluidized state, with introduction of inactive gas at the target feed rate all at one, there occurs the phenomenon that the pressure of the gas inside the container first increases sharply and then drops sharply. And, when the pressure of the gas inside the container drops after the sharp rise thereof, there occurs a temporary rapid and drastic flow or turbulent flow of the gas inside the container.

And, with occurrence of the phenomenon that the pressure of the gas inside the container first increases sharply and then drops sharply, vibration may occur in the container, which may cause in turn vibration of the substrate. Also, with occurrence of the temporary rapid and drastic flow or turbulent flow of the gas inside the container, there may occur vibration of the substrate due to the flow of the gas inside the container and/or floating of particles accumulated on the bottom of the container.

Incidentally, such vibration of the substrate and floating of particles accumulated on the bottom of the container will occur more conspicuously when the target feed rate is set to a sufficiently high rate for allowing the interior of the container to reach the condition of being filled with inactive gas within a short period after the start of inactive gas introduction.

SUMMARY OF THE INVENTION

In view of the above-described state of the art, there is a need for realizing an inactive gas introducing facility capable of avoiding deterioration of the substrate from its proper state and adhesion of particles on the substrate at the time of introduction of inactive gas into the container.

According to the present invention, an inactive gas introducing facility comprises:

an introducing device disposed in a support portion supporting a container accommodating a substrate and configured for introducing inactive gas to the inside of the container through a gas feed opening of the container with discharging gas present inside the container to the outside through a gas discharge opening of the container: and a controller for controlling operation of the introducing device;

wherein the introducing device is capable of varying the feed rate of the inactive gas; and the controller is configured to control the operation of the introducing device such that in the feeding of the inactive gas to the container supported to the support portion, the feed rate is increased progressively to a target feed rate.

With the above-described arrangement, in the feeding of the inactive gas to the container supported to the support portion, the feed rate of the inactive gas to be fed to the container by the feeding device is increased progressively to a target feed rate. Thus, it is possible to restrict occurrence of sharp drastic change of the pressure of the gas inside the container during the feeding of inactive gas into the container.

Namely, with the progressive increase of the feed rate of the inactive gas to be fed to the container by the feeding device, the change to the fluidized state in correspondence with the feed rate of the inactive gas being introduced can occur smoothly. As a result, sharp drastic change in the pressure of the gas inside the container can be restricted.

As described above, at the time of introduction of inactive gas into the container, sharp and drastic change in the pressure of the gas inside the container can be effectively restricted, and the shift of the change of the gas inside the container to the fluidized state in accordance with the feed rate of the inactive gas being introduced can proceed in a smooth manner. Therefore, it is possible to restrict vibration of the container and resultant vibration of the substrate and also possible to restrict occurrence of vibration of the substrate and floating of particles due to sharp drastic flow or turbulent flow of the gas inside the container. As a result, it is possible to avoid deterioration of the substrate from its proper state and floating of particles accumulated on the bottom of the container and subsequent adherence thereof on the substrate.

The technical features of the inactive gas introducing facility relating to the present invention is applicable also to an inactive gas introducing method; hence, the invention includes such method in its scope. With this inactive gas introducing method too, the same advantageous effect achieved by the above-described inactive gas introducing facility can be achieved.

That is, according to the present invention, an inactive gas introducing method utilizing an inactive gas introducing facility including an introducing device disposed in a support portion supporting a container accommodating a substrate and configured for introducing inactive gas to the inside of the container through a gas feed opening of the container with discharging gas present inside the container to the outside through a gas discharge opening of the container and a controller for controlling operation of the introducing device, the introducing device being capable of varying the feed rate of the inactive gas in response to a feed rate command issued by the controller, the method comprising the following step that is effected by the controller:

a feed rate progressively increasing step for commanding to the introducing device a feed rate command for progressively increasing the feed rate to a target feed rate in the feeding of the inactive gas to the container supported to the support portion.

Next, preferred embodiments of the present invention will be described.

According to a preferred embodiment of the inactive gas introducing facility relating to the present invention, when the inactive gas is fed firstly after the container is supported to the support portion, the controller progressively increases the feed rate from zero to the target feed rate.

With the above-described arrangement, immediately after the container is supported to the support portion, even if the target feed rate is set to a sufficiently high feed rate so that the interior of the container may be filled with the inactive gas within a short period, it is still possible to avoid deterioration of the substrate from its proper state and floating of particles accumulated on the bottom of the container and subsequent adherence thereof on the substrate.

According to a further preferred embodiment of the inactive gas introducing facility relating to the present invention, the support portion is a storage section of a storage shelf for storing the container;

as the target feed rate, there are set an initial target feed rate and a steady-state target feed rate which is lower than the initial target feed rate;

when the inactive gas is fed to the container supported to the support portion, the controller controls the operation of the introducing device in order to adjust the feed rate first to the initial target feed rate and then adjust the feed rate to the steady-state target feed rate; and in the adjustment of the feed rate to the initial target feed rate, the controller controls the operation of the introducing device to progressively increase the feed rate to the initial target feed rate.

With the above-described arrangement, when the inactive gas is fed to the stored container, the feed rate is adjusted first to the initial target feed rate and then to the steady-state target feed rate lower than the initial target feed rate. Therefore, even if the initial target feed rate is set to a high feed rate such that inside of the container may be filled with the inactive gas within a short period after the start of inactive gas introduction, as the steady-state target feed rate is set to a lower feed rate thereby to maintain the inside of the container filled with the inactive gas at this steady-state target feed rate, the consumption amount of the inactive gas may be restricted.

Moreover, when the feed rate is adjusted to the initial target feed rate, the feed rate is progressively increased toward this initial target feed rate. Therefore, sharp drastic change in the pressure of the gas inside the container can be restricted at the time of introduction of inactive gas into the container and at the same time smooth change to the fluidized state in accordance with the feed rate of the introduced inactive gas is made possible. Consequently, it is possible to avoid deterioration of the substrate from its proper state and adhesion of particles on the substrate.

According to a still further preferred embodiment of the inactive gas introducing facility relating to the present invention, when the feed rate is changed from the initial target feed rate to the steady-state target feed rate, the operation of the introducing device is controlled such that the feed rate is decreased at a higher change rate than the change rate of the feed rate at the time of progressive increase of the feed rate to the initial target feed rate.

When the feed rate is changed from the initial target feed rate to the steady-state target feed rate, even if the feed rate is decreased sharply, this will hardly invite generation of vibration in the container or subsequent vibration of the substrate therein. Also, there is not much possibility of generation of temporary sharp drastic flow in the flow of the gas inside the container which would cause vibration of the substrate or floating of particles accumulated on the bottom of the container. In view of these, according to the above-described arrangement, when the feed rate is changed from the initial target feed rate to the steady-state target feed rate, the feed rate is decreased at a higher change rate than the change rate of the feed rate at the time of the progressive increase of the feed rate to the initial target feed rate.

With the above, in comparison with the case wherein the feed rate is progressively decreased toward the steady-state target feed rate when the feed rate is changed from the initial target feed rate to the steady-state target feed rate, the consumption amount of the inactive gas can be restrained, as a result, the reduction of running cost can be realized.

According to a still further preferred embodiment of the inactive gas introducing facility relating to the present invention, after the controller changes the feed rate from the initial target feed rate to the steady-state target feed rate, the controller controls the operation of the introducing device so as to repeat a cycle of waiting for lapse of a set feed period and then pausing the feeding of the inactive gas for a set pause period after lapse of the set feed period; and in adjusting the feed rate to the steady-state target feed rate after lapse of the set pause period, the controller controls the operation of the introducing device so as to progressively increase the feed rate toward the steady-state target feed rate.

If the feeding of inactive gas is stopped when the inactive gas has been fed to the container at the steady-state target feed rate for a set feed period, the inactive gas inside the container will leak gradually through a gap present in this container. Nevertheless, for a certain period, the condition of the inactive gas filling the interior of the container will be maintained, thereby to restrict deterioration of the substrate from its proper state.

In view of the above, according to the above-described arrangement, after the feed rate is changed from the initial target feed rate to the steady-state target feed rate, the inactive gas is fed to the container in such a manner as to repeat a cycle of waiting for lapse of a set feed period and then pausing the feeding of the inactive gas for a set pause period after lapse of the set feed period. With this, the consumption amount of inactive gas can be further restrained.

Moreover, when the feed rate is adjusted to the steady-state target feed rate after lapse of the set pause period, the feed rate is progressively increased toward the steady-state target feed rate. Therefore, in the course of introduction of inactive gas into the container, sharp drastic change in the pressure of the gas inside the container can be restricted. And, at the same time, the fluid condition of the gas present inside the container can be changed smoothly to a fluidized state in accordance with the feed rate of the inactive gas being introduced. As a result, it becomes possible to avoid deterioration of the substrate from its proper state and adhesion of particles on the substrate.

According to a still further preferred embodiment of the inactive gas introducing facility relating to the present invention, when the controller progressively increases the feed rate, the controller controls the operation of the introducing device such that the feed rate is increased by a set amount upon each lapse of a set wait period.

With the above-described arrangement, the progressive increase of the feed rate can be realized with a simple control configuration.

More particularly, in progressively increasing the feed rate, it is conceivable to progressively increase the feed rate in a continuous manner. In this case, however, for operating the introducing device, the configuration of the controller will be complicated since there arises a need to provide it with a function generator for generating command values for the continuous increase of the feed rate in association with lapse of the period.

In contrast, in progressively increasing the feed rate, if the feed rate is increased by a set amount upon each lapse of a set wait period, this can be realized by means of a program to be installed in the controller constituted of a microcomputer. Hence, the progressive increase of the feed rate can be realized with a simple control configuration.

According to a still further preferred embodiment of the inactive gas introducing facility relating to the present invention, the facility further comprises a manual operation type setting device for variably setting the set amount.

With the above-described arrangement, it is possible not only to avoid deterioration of the substrate from its proper state or adhesion of particles on the substrate, but also to set the set amount to any desired value, to e.g. as largest possible value, in accordance with the container or the substrate employed. Hence, the progressive increase of the feed rate can be effected in an even more favorable manner.

According to a further preferred embodiment of the inactive gas introducing method relating to the present invention, at the feed rate progressively increasing step, when the inactive gas is fed for the first time after the container is supported to the supporting portion, a feed rate command for progressively increasing the feed rate from zero to the target feed rate is issued to the introducing device.

According to a further preferred embodiment of the inactive gas introducing method relating to the present invention, the support portion is a storage section of a storage shelf for storing the container;

the method further comprises a feed rate adjusting step to be executed by the controller, in which in feeding the inactive gas to the container supported to the storage section, the feed rate is adjusted first to an initial target feed rate and then to a steady-state target feed rate which is lower than the initial target feed rate; and at the feed rate adjusting step, in adjusting the feed rate to the initial target feed rate, the feed rate progressively increasing step is effected with using the initial target feed rate as the target feed rate.

According to a still further preferred embodiment of the inactive gas introducing method relating to the present invention, at the feed rate adjusting step, when the feed rate is changed from the initial target feed rate to the steady-state target feed rate, a feed rate command is issued to the introducing device for decreasing the feed rate at a higher change rate than the change rate of the feed rate at the time of progressive increase of the feed rate to the initial target feed rate at the feed rate progressively increasing step.

According to a still further preferred embodiment of the inactive gas introducing method relating to the present invention, at the feed rate adjusting step, after the feed rate is changed from the initial target feed rate to the steady-state target feed rate, the method effects an intermittent feed step for repeating a cycle of waiting for lapse of a set feed period and then pausing the feeding of the inactive gas for a set pause period upon lapse of the set feed period; and at the intermittent feed step, in adjusting the feed rate to the steady-state target feed rate after lapse of the set pause period, the feed rate progressively increasing step is effected with using the steady-rate target feed rate as the target feed rate.

According to a still further preferred embodiment of the inactive gas introducing method relating to the present invention, at the feed rate progressively increasing step, a feed rate command is issued to the introducing device for increasing the feed rate by a set amount upon each lapse of a set wait period.

According to a still further preferred embodiment of the inactive gas introducing method relating to the present invention, the inactive gas introducing facility further comprises a manual operation type setting device for variably setting the set amount.

DETAILED DESCRIPTION

Next, embodiments of the present invention as being applied to an article storage facility will be explained with reference to the accompanying drawings.
(General Construction)

Figure 1:
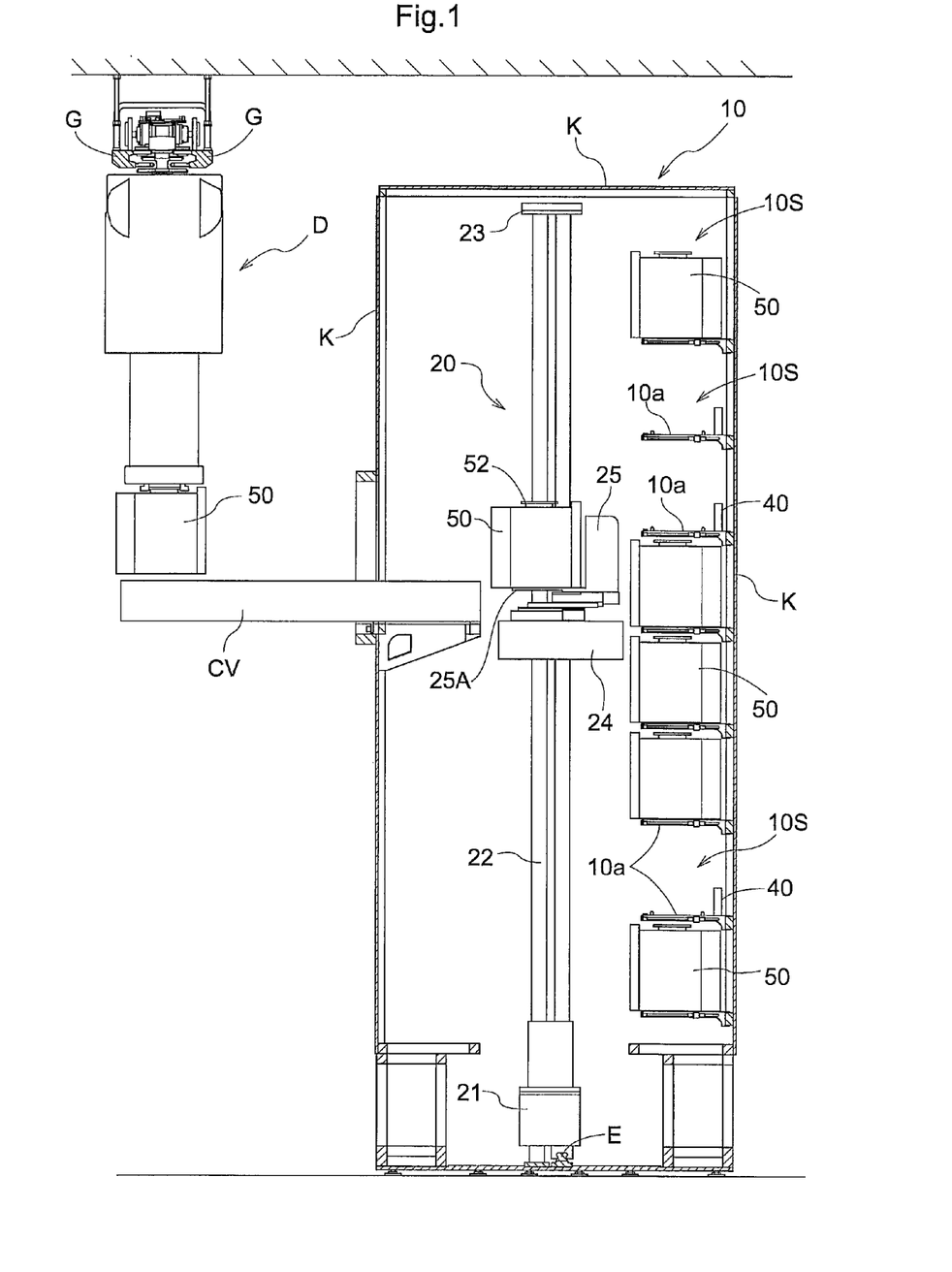
FIG. 1 is a front view in vertical section showing an article storage facility.
Figure 2:
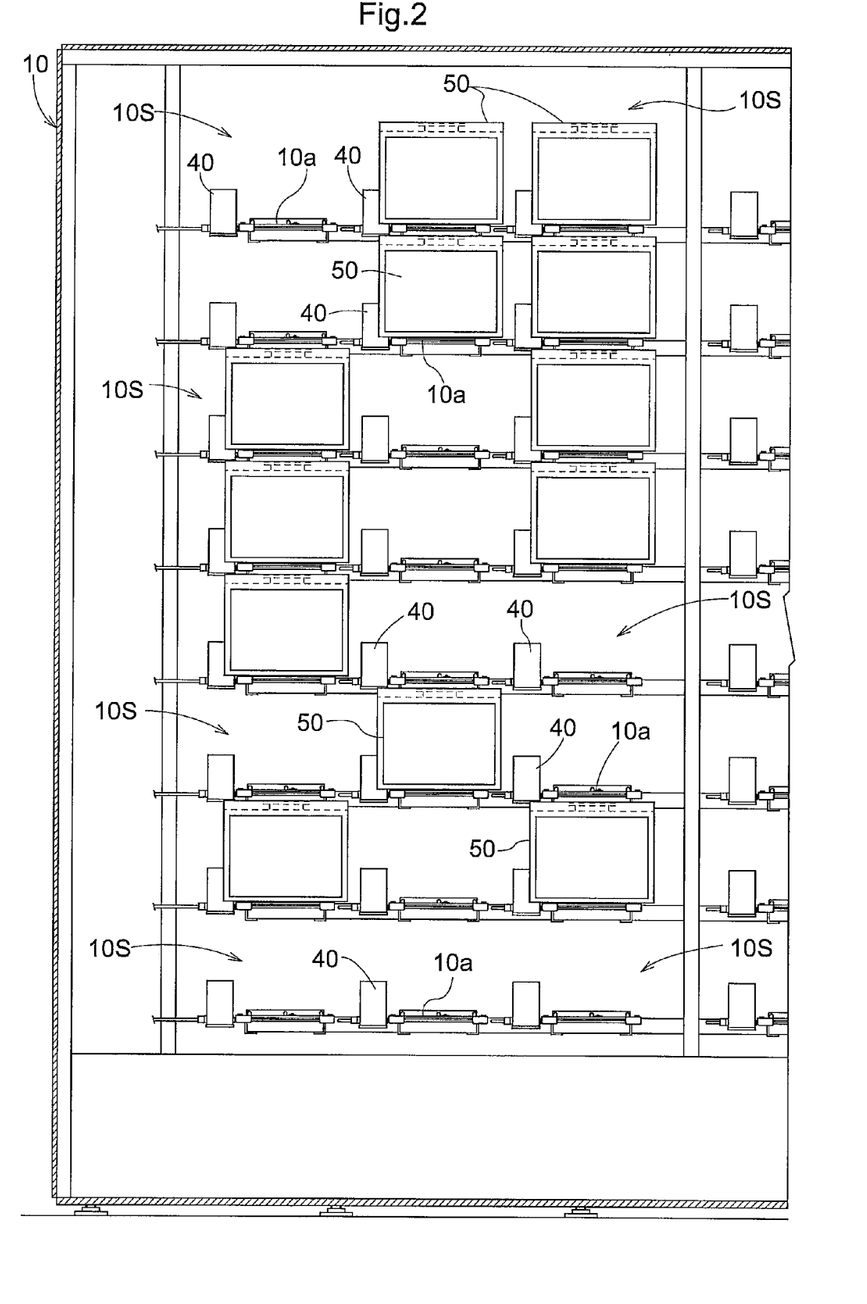
FIG. 2 is a cutaway side view showing the facility.

An article storage facility, as shown in FIG. 1 and FIG. 2, includes a storage shelf 10 for storing transport containers 50 (to be referred to shortly as "containers 50" hereinafter) each accommodating substrates therein under a sealed state, a stacker crane 20 as a transport device, and a carry in/out conveyor CV as a carry in/out section for the containers 50.

The storage shelf 10 and the stacker crane 20 are disposed in an installment space having its outer periphery covered with a wall body K and the carry in/out conveyor CV is disposed to extend through the wall body K.

The storage shelf 10 includes a plurality of storage sections 10S, as support portions for supporting the containers 50, juxtaposed along the vertical direction and the right/left direction, each of the plurality of storage sections 10S being configured to store the container 50. The details of this will be explained later.

And, in the instant embodiment, as shown in FIG. 1, there is mounted a hoist-type transport carriage D which travels along a guide rail G attached to the ceiling portion of a cleanroom in which the article storage facility is installed. By this hoist type transport carriage D, the container 50 can be carried in/out relative to the carry in/out conveyer CV.
(Construction of Container 50)

The container 50 is a gas-sealed container made of synthetic resin in compliance with the SEMI (Semiconductor Equipment and Material Institute) standard and is used for accommodating a semiconductor wafer W (see FIG. 4) as a substrate. This container 50 is referred to as a FOUP (Front Opening Unified Pod). And, though not detailed herein, in the front face of the container 50, there is formed an opening which can be opened/closed with a detachable lid for carrying in/out substrates. In the upper face of the container 50, there is formed a top flange 52 (see FIG. 4) which can be gripped by the hoist type transport carriage D. In the bottom face of the container 50, there are formed three engagement grooves (not shown) engageable by positioning pins 10b (see FIG. 3).

Figure 4:
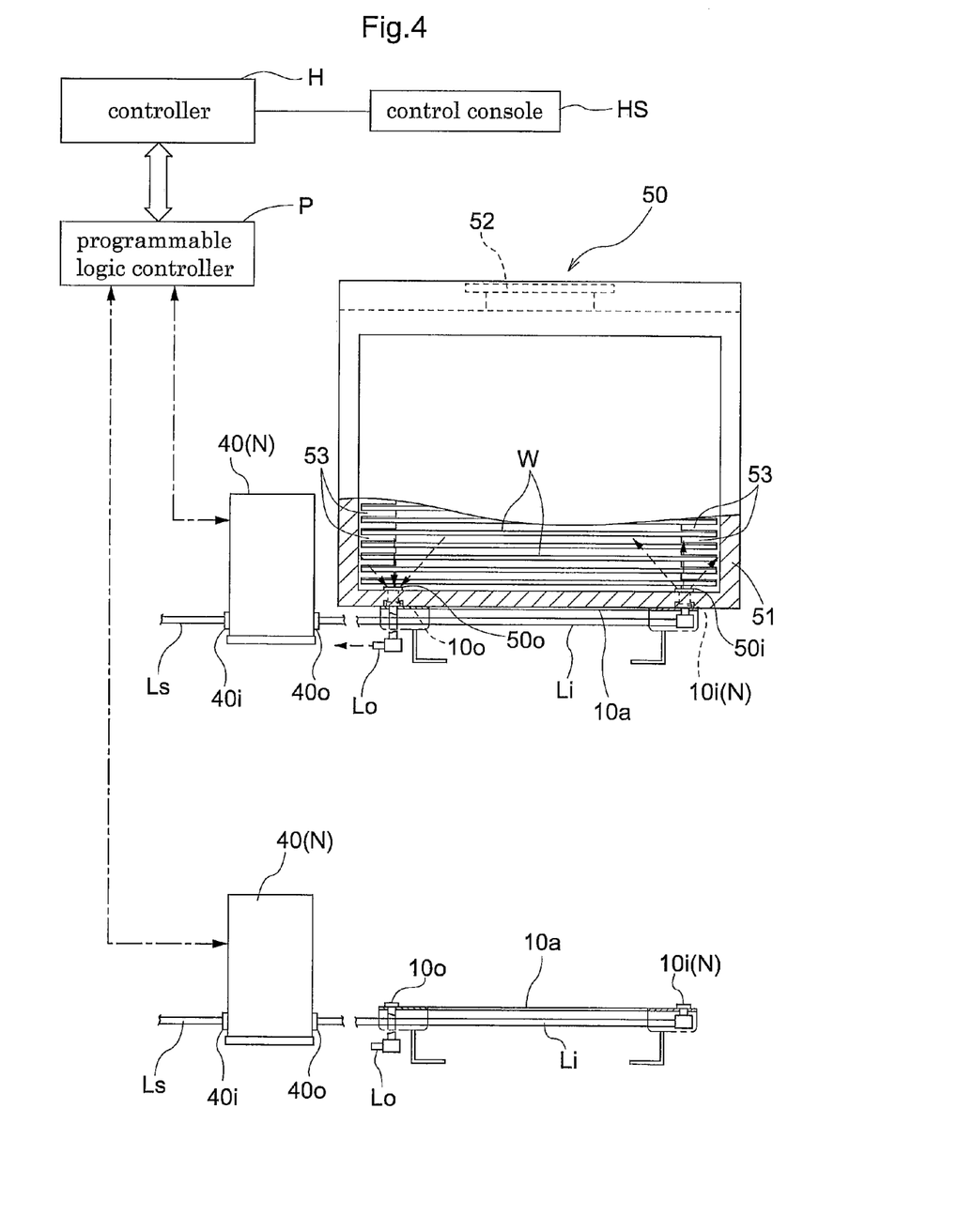
FIG. 4 is an explanatory view illustrating an introducing condition of nitrogen gas.

More particularly, the container 50, as shown in FIG. 4, includes a casing 51 having substrate supports 53 capable of loading a plurality of semiconductor wafers W at different vertical positions therein and an unillustrated lid. The container 50 is configured such that the inner space thereof is sealed gas-tightly when the lid is attached to the casing 51. And, when the container 50 is stored in the storage section 10S, the container 50 is fixed in position by the positioning pins 10b.

Further, as shown in FIG. 4, in the bottom of the container 50, there are provided a gas feed opening 50i for introducing an amount of nitrogen gas as an inactive gas and a gas discharge opening 50o. Though not shown, at the gas feed opening 50i, there is provided an introducing side opening/closing valve: and at the gas discharge opening 50o, there is provided a discharging side opening/closing valve.

The introducing side opening/closing valve is urged in its closing direction by means of an urging member such as a spring. In operation, when the discharge pressure of nitrogen gas fed to the gas feed opening 50i becomes higher than a set valve opening pressure higher than the atmospheric pressure by a set value, the introducing side opening/closing valve is opened by this pressure.

Further, the discharging side opening/closing valve is urged by an urging member such as a spring in the closing direction, so that when the pressure inside the container 50 reaches a pressure higher than a set valve opening pressure higher than the atmospheric pressure by a set value, the valve is opened by this pressure.
(Construction of Stacker Crane 20)

The stacker crane 20, as shown in FIG. 1, includes a traveling carriage 21 which can run along a traveling rail E installed on the floor on the side of the front face of the storage shelf 10, a mast 22 mounted erect on the traveling carriage 21, and a lift deck 24 which can move up/down as being guided by the mast 22.

Incidentally, though not shown, an upper frame 23 provided at the upper end of the mast 22 is movable as being engaged with an upper guide rail attached to the ceiling of the installment space having its outer periphery covered by the wall body K.

On the lift deck 24, there is mounted a transfer device 25 for transferring the container 50 to/from the storage section 10S.

The transfer device 25 includes a plate-like loading support body 25A which loads and supports the container 50 thereon, with the loading support body 25A being projectable and retractable between a projecting position projecting into the storage section 10S and a retracted position retracted toward the lift deck 24 side. The stacker crane 20 including the transfer device 25 is configured to effect an unloading operation for unloading the container 50 loaded on the loading support body 25A onto the storage section 10S, and a retrieving operation for retrieving the container stored in the storage section 10S, in association with projecting/retracting operations of the loading support body 25A and lifting up/down operations of the lift deck 24.

Incidentally, the stacker crane 20 having the transfer device 25 effects also unloading and retrieving operations relative to the carry in/out conveyer CV, thus effecting transfer operations relative to the carry in/out conveyer CV.

The stacker crane 20, though not shown, includes a traveling position detector for detecting the traveling position on the traveling passage and a lifting position detector for detecting the lifting position of the lift deck 24. So that, based on detection information of the traveling position detector and the lifting position detector, a crane controller (not shown) for controlling operations of the stacker crane 20 controls the operations of the stacker crane 20.

More particularly, in order to effect a carry-in operation for carrying a container 50 carried into the carry in/out conveyer CV into the storage section 10S and a carry-out operation for carrying the container 50 stored in the storage section 10S out onto the carry in/out conveyer CV, the crane controller controls the traveling operation of the traveling carriage 21, the lifting operation of the lift deck 24 and the projecting/retracting operations of the loading support body 25A of the transfer device 25.

(Construction of Storage Section 10S)

Figure 3:
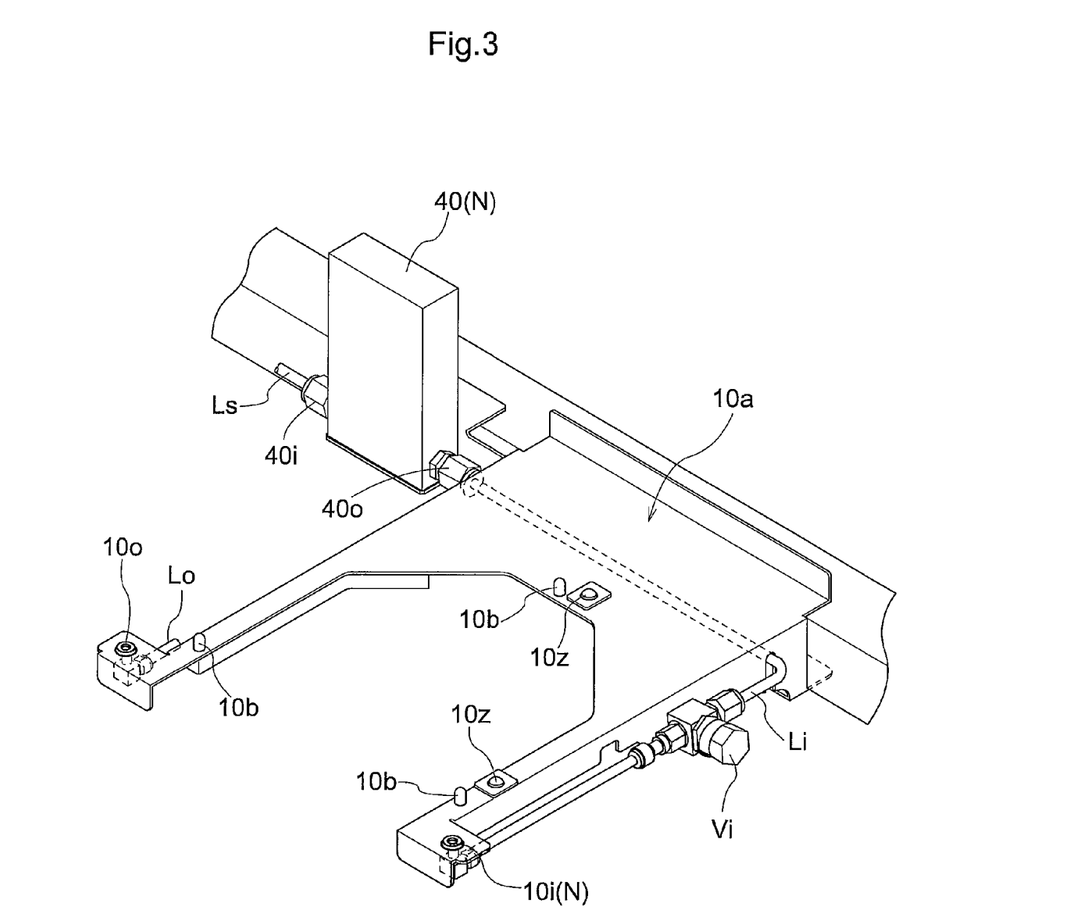
FIG. 3 is a perspective view showing a storage section.

As shown in FIG. 3 and FIG. 4, each one of the plurality of storage sections 10S includes a plate-like loading support portion 10a for loading and supporting the container 50 thereon (see FIG. 1).

This loading support portion 10a has an U-shape as viewed in the plane view thereof so as to form a space for allowing vertical passage of the loading support body 25A of the transfer device 25, and in the upper face, the afore-mentioned positioning pins 10b project upwards therefrom.

Further, the loading support portion 10a includes a pair of load presence sensors 10z for detecting whether the container 50 is loaded or not (that is, whether a container 50 is loaded in the storage section 10S or not). And, detection information thereof are inputted to a controller H (see FIG. 4) for managing the operation of a mass flow controller 40 which will be described later.

The loading support portion 10a further includes a discharge nozzle 10i for feeding nitrogen gas as an inactive gas into the container 50 and a discharging gas passage body 10o to be passed by a gas discharged from the inside of the container 50. Further, each storage section 10S mounts the mass flow controller 40 for controlling feeding of the nitrogen gas (see FIG. 2).

And, the discharge nozzle 10i is connected to a feed piping Li for flowing the nitrogen gas from the mass flow controller 40 and to the discharging gas passage body 10o, there is connected a discharge pipe Lo having an open end.

When the container 50 is loaded and supported on the loading support portion 10a, the discharge nozzle 10i is connected under an engaged state to the gas feed opening 50i of the container 50 and the discharging gas passage body 10o is connected under an engaged state to the gas discharge opening 50o of the container 50.

Then, under the condition of the container 50 being loaded and supported on the loading support portion 10a, nitrogen gas is discharged from the discharge nozzle 10i at a pressure higher than the atmospheric pressure by a set value, whereby the gas present inside the container 50 is discharged through the gas discharge opening 50o to the outside and the nitrogen gas can be introduced to the inside of the container 50 through the gas feed opening 50i of the container 50.

Incidentally, as shown in FIG. 3, the feed piping Li incorporates a manual operation type opening/closing valve Vi, such that a change of condition to stop the feeding of the nitrogen gas may be realized at the time of e.g. an emergency due to malfunctioning of the mass flow controller 40.

(Construction of Mass Flow Controller 40)

As shown in FIG. 3 and FIG. 4, the mass flow controller 40 includes an introducing side port 40i and a discharging side port 40o. To the discharging side port 40o, the feed piping Li is connected. And, to the introducing side port 40i, there is connected an introducing side piping Ls for guiding nitrogen gas from a nitrogen gas feed source (not shown) such as a nitrogen gas cylinder.

Incidentally, the nitrogen gas feed source includes a governor for adjusting the feed pressure of the nitrogen gas to a set pressure higher than the atmospheric pressure by a set value, a manual operation type opening/closing valve for allowing/inhibiting feeding of the nitrogen gas, etc.

The mass flow controller 40 includes a feed rate adjusting valve for variably adjusting the feed rate of the nitrogen gas (the feed rate to the container 50) which flows in the inner passage from the introducing side port 40i to the discharging side port 40o, a feed rate sensor for determining the feed rate of the nitrogen gas (the feed rate to the container 50) which flows in the inner passage, and an internal control unit for controlling the operations of the feed rate adjusting valve.

And, the internal control unit is configured to control the feed rate adjusting valve based on the detection information from the feed rate sensor so as to adjust the feed rate to the container 50 to a target feed rate commanded from the afore-mentioned controller H. More particularly, the internal control unit controls the feed rate adjusting valve in such a manner as to cause the feed rate to the container 50 to comply with a feed rate command issued from the controller H.

In the instant embodiment, the mass flow controller 40 adjusts the feed rate of the nitrogen gas flowing in the internal passage (the feed rate to the container 50) between zero and 50 liters/min. The mass flow controller 40 employed in the instant embodiment is configured to adjust the feed rate to a target feed rate (feed rate command) commanded by the controller H in the entire feed rate adjustment range at a high speed (e.g. within 1 second).

Incidentally, in the instant embodiment, the introducing device N for introducing nitrogen gas as an inactive gas from the gas feed opening 50i of the container 50 to the interior of the container 50 with discharging the gas inside the container 50 to the outside through the gas discharge opening 50o includes the mass flow controller 40 and the discharge nozzle 10i as its principal components and the controller H controls the operations of the introducing device N. And, the introducing device N is configured to be capable of varying the feed rate of the nitrogen gas as an inactive gas in accordance with the feed rate command from the controller H.

(Target Feed Rate of Controller H)

The controller H, as shown in FIG. 4 commands, via a programmable logic controller P, a target feed rate (feed rate command) to the mass flow controller 40 provided in correspondence with each one of the plurality of storage sections 10S.

Incidentally, the controller H is provided with a control console HS for allowing inputs of various kinds of information.

The target feed rate commanded by the controller H includes, as some non-limiting examples thereof, a target feed rate for storage to be commanded to the mass flow controller 40 in order to introduce nitrogen gas into the container 50 when this container 50 is accommodated in the storage section 10S, a target feed rate for nozzle cleaning to be commanded in order to clean the discharge nozzle 10$i$ immediately before the container 50 is accommodated in the storage section 10S, and a target feed rate for cleaning to be commanded in order to clean the discharge nozzle 10$i$, the feed piping Li, etc. at the time of e.g. installment of the storage shelf 10. Specifically, the controller H commands to the mass flow controller 40 (introducing device N) a feed rate command for adjusting the feed rate of the nitrogen gas to the container 50 to a target feed rate for storage, a target feed rate for nozzle cleaning, or a target feed rate for cleaning.

Figure 5:
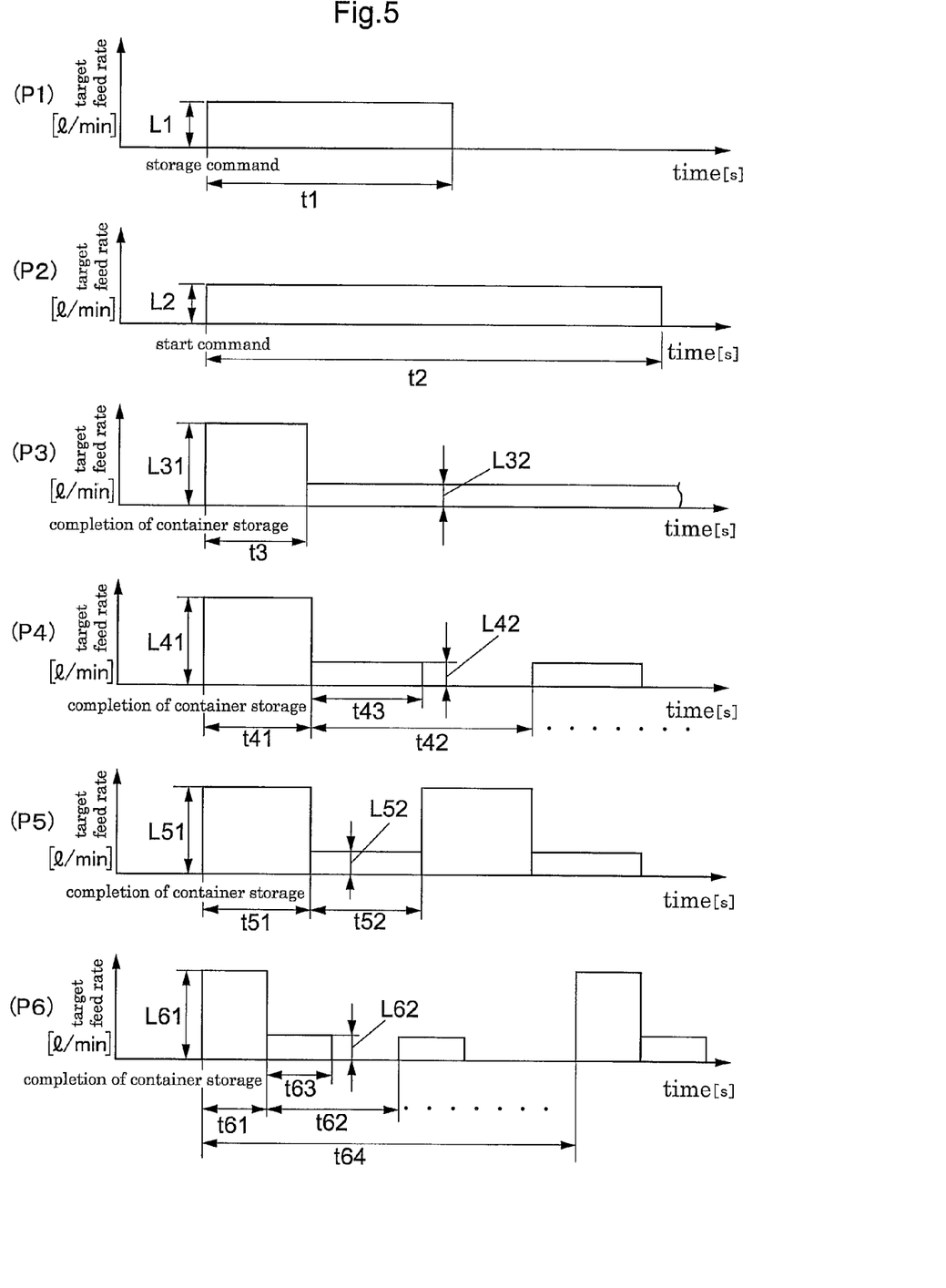
FIG. 5 is an explanatory view showing purge patterns of nitrogen gas.

Namely, the controller H, as shown in FIG. 5, stores therein, as a plurality of purge patterns each defining a target feed rate and a feed period, a nozzle purge pattern P1, a cleaning pattern P2 and four storage purge patterns P3-P6.

And, at the time of e.g. installment of the storage shelf 10, when a cleaning start command is issued via the control console HS, the controller H commands a target feed rate (feed rate) for cleaning, in accordance with the cleaning pattern P2.

Further, upon completion of carry-in of the container 50 onto the carry in/out conveyer CV, the controller H issues a target feed rate for nozzle cleaning according to the nozzle purge pattern P1.

In the instant embodiment, the controller H is configured to determine the timing of the carry-in of the container 50 onto the carry in/out conveyer CV via communication thereto of a storage command from a carriage controller (not shown) for controlling the operation of the hoist type transport carriage D.

That is, when the transport carriage D has carried in a container 50 on the carry in/out conveyer CV, the carriage controller issues a storage command to the controller H.

Further, in response to detection of the container 50 by two load presence sensors 10$z$, the controller H issues a target feed rate for storage according to one pattern selected via the control console HS from the four storage purge patterns P3-P6.

Incidentally, the target feed rates and the feed periods according to the nozzle purge pattern P1 and the cleaning pattern P2 are set in advance to standard states. On the other hand, the target feed rates and the feed periods according respectively to the four storage purge patterns P3-P6 are set respectively by the user at the time of e.g. installment of the facility.

More particularly, the user will variably set, via the control console HS, the target feed rate and the feed period according to each of the four storage purge patterns P3-P6 and will proceed to experimentally use each of the four storage purge patterns P3-P6, thus setting the target feed rate and the feed period of one preferred pattern from the four storage purge patterns P3-P6, and selecting this preferred pattern.

(Purge Patterns)

Next, the nozzle purge pattern P1, the cleaning purge pattern P2 and the four storage purge patterns P3-P6 respectively will be explained in greater details with reference to FIG. 5.

The nozzle purge pattern P1 is defined as a pattern for feeding nitrogen gas for a period t1 set as pre-storage period from the timing of the issuance of the above-described storage command at a target feed rate L1 set as the target feed rate for nozzle cleaning.

The feed period t1 is set to e.g. 5 seconds and the target feed rate L1 is set to e.g. 30 liters/min.

The cleaning pattern P2 is defined as a pattern for feeding nitrogen gas for a period t2 set as a setting initial feed period from issuance of the cleaning start command via the control console HS at a target feed rate L2 which is set as the target feed rate for cleaning.

The feed period t2 is set to e.g. 1800 seconds and the target feed rate L2 is set to e.g. 20 liters/min.

Regarding each one of the four storage purge patterns P3-P6, as the target feed rate for storage, there are set an initial target feed rate and a steady-state target feed rate which is lower (smaller) than the initial target feed rate.

The initial target feed rate is set to e.g. 50 liters/min. and the steady-state target feed rate is set to e.g. 5 liters/min. As described above, the initial target feed rate and the steady-state target feed rate will be variably set by the user.

And, for each one of the four storage purge patterns P3-P6, in feeding nitrogen gas to the container 50, these patterns are common in that first the initial target feed rate is set as the target feed rate and then the steady-state target feed rate is set as the target feed rate. Except this, these patterns are set as patterns different from each other. That is, the four storage purge patterns P3-P6 are purge patterns when the controller H executes a feed rate adjusting step for adjusting the feed rate of nitrogen gas to the initial target feed rate and then to the steady-state target feed rate which is lower than the initial target feed rate.

Hereinafter, the four storage purge patterns P3-P6 will be referred to respectively as the first storage purge pattern P3, the second storage purge pattern P4, the third storage purge pattern P5, and the fourth storage purge pattern P6 and these respective patterns will be explained further.

The first storage purge pattern P3 is defined as a pattern as follows. According to this pattern, during a set feed period t3 from the completion of container storage, i.e. completion of storage of the container 50 at the storage section 10S, the nitrogen gas is fed at the feed rate L31 as the initial target feed rate. Thereafter the nitrogen gas is fed at the feed rate L32 as the steady-state target feed rate, and this feeding is continued during continued detection of the presence of the container 50 by the pair of load presence sensors 10$z$.

Incidentally, the timing of completion of container storage is set as the timing when a set period (e.g. 2 seconds) has lapsed after detection of the container 50 by the pair of load presence sensors 10$z$.

The second storage purge pattern P4 is defined as a pattern as follows. Namely, during a set feed period t41 from the completion of container storage, the nitrogen gas is fed at the feed rate L41 as the initial target feed rate and thereafter the nitrogen gas is fed intermittently at the feed rate L42 as the steady-state target feed rate, and this intermittent feeding is continued during continued detection of the presence of the container 50 by the pair of load presence sensors 10$z$.

That is, the second storage purge pattern P4 is set as a pattern according to which after change of the target feed rate from the feed rate L41 as the initial target feed rate to the feed rate L42 as the steady-state target feed rate, feeding of nitrogen gas is continued for the set feed period t43 and then the feeding is paused for the set pause period and these feeding and pausing are repeated. Namely, after the change of the target feed rate from the feed rate L41 to the feed rate L42, upon lapse of the set feed period t43, feeding of nitrogen gas is paused for a set pause period. In this way, the intermittent feeding step is effected.

Namely, after the change of the target feed rate from the feed rate L41 as the initial target feed rate to the feed rate L42 as the steady-state target feed rate, of a repetition cycle t42, during the set feed period t43, nitrogen gas is fed at the feed rate L42 and during the set pause period t42-t43, feeding of nitrogen gas is paused. These operations are effected in repetition during continued detection of the container 50 by the pair of load presence sensors 10z.

Incidentally, in this second storage purge pattern P4, the repetition cycle t42 too is variably set by the user.

The third storage purge pattern P5 is defined as a pattern as follows. Namely, during the set feed period t51 after completion of storage of container, nitrogen gas is fed at the feed rate L51 as the initial target feed rate. Thereafter, during the set feed period t52, nitrogen gas is fed at the feed rate L52 as the steady-state target feed rate. This basic pattern is repeated during continued detection of the presence of container 50 by the pair of load presence sensors 10z.

The fourth storage purge pattern P6 is defined as a pattern as follows. Namely, during the set feed period t61 after completion of storage of container, nitrogen gas is fed at the feed rate L61 as the initial target feed rate. Thereafter, during the set feed period t64-t61, nitrogen gas is fed intermittently at the feed rate L62 as the steady-state target feed rate. This basic pattern is continued during continued detection of the presence of container 50 by the pair of load presence sensors 10z.

That is, in the fourth storage purge pattern P6, there are set a first repetition cycle t64 in which feeding of gas at the feed rate L61 as the initial target feed rate is repeated and a second repetition cycle t62 in which intermittent feeding of nitrogen gas at the feed rate L62 as the steady-state target feed rate is repeated.

And, at the time of completion of container storage and at the time of start of the first repetition cycle t64, during the set feed period t61, nitrogen gas is fed at the feed rate L61 as the initial target feed rate. And, upon completion of feeding of nitrogen gas at the feed rate L61 as the initial target feed rate, during the set feed period t63, nitrogen gas is fed at the feed rate L62 as the steady-state target feed rate and feeding of nitrogen gas is paused during the set pause period t62-t63. These operations are repeated in alternation.

Incidentally, in this fourth storage purge pattern P6, the first repetition cycle t64 and the second repetition cycle t62 too are variably set by the user.

In the instant embodiment, when the feed rate of nitrogen gas to the container 50 is changed from zero (feeding paused state) to the initial target feed rate including the case of feeding nitrogen gas for the first time immediately after storage of the container 50 to the storage section 10S, the controller H commands a target feed rate (feed rate command) to the mass flow controller 40 so as to progressively increase the feed rate of nitrogen gas toward the initial target feed rate. Similarly, when the feed rate of nitrogen gas to the container 50 is changed from zero (feeding paused state) to the steady-state target feed rate, the controller H commands a target feed rate (feed rate command) to the mass flow controller 40 so as to progressively increase the feed rate of nitrogen gas toward the steady-state target feed rate. In these ways, the controller H executes a feed rate progressively increasing step for commanding to the introducing device N a feed rate command for progressively increasing the rate toward the target feed rate, at the time of adjustment of feed rate of nitrogen gas to the container 50 from zero to the initial target feed rate or the steady-state target feed rate.

Further, at the time of changing the feed rate of nitrogen gas to the container 50 from the initial target feed rate to the steady-state target feed rate, the controller H commands a target feed rate (feed rate command) to the mass flow controller 40 such that the feed rate of the nitrogen gas may be reduced by a higher change rate per unit time than the case of progressively increasing the feed rate of nitrogen gas toward the initial target feed rate.

Similarly, at the time of changing the feed rate of nitrogen gas to the container 50 from the steady-state target feed rate to zero (feeding paused state), the controller H commands a target feed rate (feed rate command) to the mass flow controller 40 such that the feed rate of the nitrogen gas may be reduced by a higher change rate per unit time than the case of progressively increasing the feed rate of nitrogen gas toward the initial target feed rate. In this way, when the feed rate of nitrogen gas is changed from the initial target feed rate to the steady-state target feed rate or from the steady-state target feed rate to zero, the controller H issues to the mass flow controller 40 a feed rate command for decreasing the rate toward the steady-state target feed rate or zero, at a higher change rate than that at the time of the feed rate progressively increasing step at the time of adjustment of feed rate of nitrogen gas to the initial target feed rate.

Figure 6:
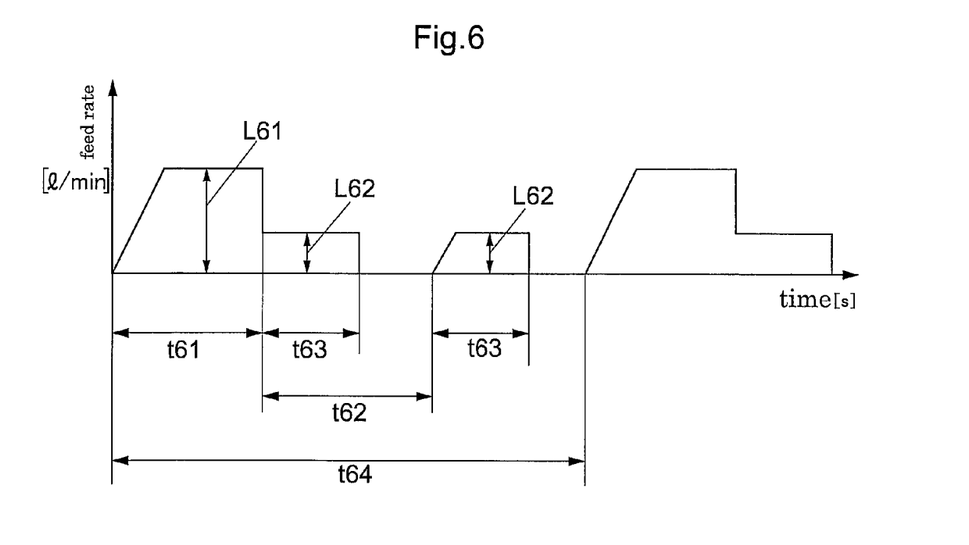
FIG. 6 is an explanatory view illustrating a configuration for controlling a feed rate of nitrogen gas.
Figure 7:
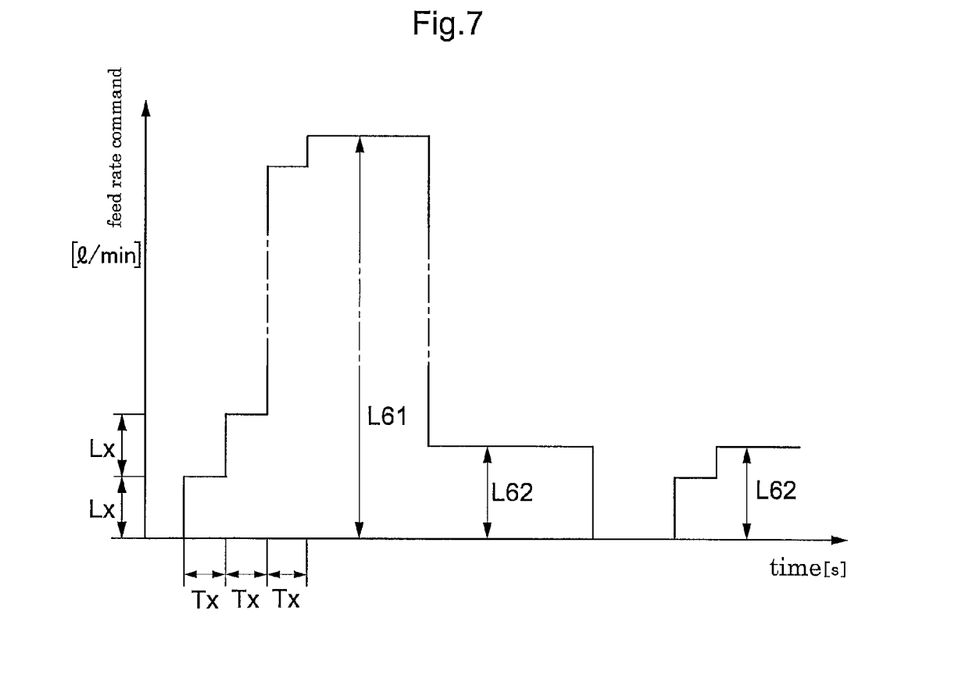
FIG. 7 is an explanatory view showing details of the configuration.

Next, with reference to FIG. 6 and FIG. 7, additional explanation will be provided with taking the fourth storage purge pattern P6 as a typical example.

As shown in FIG. 7, in the instant embodiment, when the feed rate of the nitrogen gas to the container 50 is changed from zero (feeding paused state) to the initial target feed rate, that is, at the time of execution of feed rate progressively increasing step with using the initial target feed rate as the target feed rate, the controller H commands to the mass flow controller 40 a target feed rate (feed rate command) such that the rate is incremented by a set unit amount Lx as a set amount, upon every lapse of a set unit period Tx (e.g. 1 second).

Incidentally, the set unit amount Lx is set to e.g. 3 liters/min.

Similarly, at the time of changing the feed rate of nitrogen gas to the container 50 from zero (feeding paused state) to the steady-state target feed rate, that is, at the time of execution of feed rate progressively increasing step with using the steady-state target feed rate as the target feed rate, the controller H commands to the mass flow controller 40 a target feed rate (feed rate command) such that the rate is incremented by a set unit amount Lx as a set amount, upon every lapse of a set unit period Tx (e.g. 1 second).

Namely, the controller H is configured to control the operation of the mass flow controller 40 so as to progressively increase the feed rate of nitrogen gas in such a manner that the feed rate is increased by a set unit amount Lx upon every lapse of a set unit period Tx as a set wait period. As a result, the feed rate of nitrogen gas to the container 50 will be increased progressively as illustrated in FIG. 6.

Incidentally, when the feed rate of nitrogen gas is increased by the increment of the set unit amount Lx, at the final stage, there may occur an odd amount smaller than the set unit amount Lx. In such case, this odd amount will be increased.

Further, in changing the feed rate of nitrogen gas to the container 50 from the initial target feed rate to the steady-state target feed rate, the controller H commands to the mass flow controller 40 a target feed rate (feed rate command)

which changes to the steady-state target feed rate immediately (that is, instantaneously or in step-wise).

Similarly, in changing the feed rate of nitrogen gas to the container 50 from the steady-state target feed rate to zero (feeding paused state), the controller H commands to the mass flow controller 40 a target feed rate (feed rate command) which changes to zero immediately (that is, instantaneously or in step-wise).

That is, when the controller H decreases the feed rate of nitrogen gas to the container 50, the controller H controls the operation of the mass flow controller 40 with a target feed rate (feed rate command) which rapidly decreases this feed rate. As a result, as shown in FIG. 6, the feed rate of nitrogen gas to the container 50 is decreased rapidly.

Incidentally, in the case also of changing the feed rate of nitrogen gas to the container 50 from the steady-state target feed rate to the initial target feed rate as is the case with the third storage purge pattern P5, like the case of changing the feed rate of nitrogen gas from zero (feeding paused state) to the initial target feed rate, the controller H controls the operation of the mass flow controller 40 so as to progressively increase the feed rate of nitrogen gas to the container 50.

As described above, according to the instant embodiment, when the container 50 is stored in the storage section 10S, an amount of nitrogen gas is introduced to the inside of the container 50. Thus, the semiconductor wafer W stored within the container can be maintained under the proper condition.

Moreover, as shown in FIG. 6, at the time of introducing nitrogen gas into the container 50, the feed rate of nitrogen gas to the container 50 is progressively increased. As a result, it is possible to prevent deterioration of the semiconductor wafer W from the proper condition due to falling of solvent present on the back face of the semiconductor wafer W due to vibration of the semiconductor wafer W and subsequent adhesion of the fallen solvent to the front face of another semiconductor wafer W present downwardly and also to prevent the phenomenon that particles accumulated on the bottom of the container 50 float therefrom to become adhered to the semiconductor waver W.

Incidentally, in the instant embodiment, the set unit amount Lx and the set unit period Tx have fixed values. However, these set unit amount Lx and the set unit period Tx may be rendered to be increased or decreased by the user.

Specifically, for instance, the control console HS may be used as a manual input type setting device for variably setting the set unit amount Lx as the set amount, thereby to variably set the set unit amount Lx. Similarly, the control console HS may be used as a setting device for variably setting the set unit period Tx, thereby to variably set the set unit period Tx.

Further, in the instant embodiment, while the feed rate of nitrogen gas to the container 50 is progressively increased, the set unit amount Lx is set to a fixed value. Instead, the set unit amount Lx may be set such that the set unit amount Lx is progressively increased or the set unit amount Lx is progressively decreased or the set unit amount Lx is progressively increased to an intermediate point and then progressively decreased. In such cases, it is possible to render this set unit amount Lx to be variably set by the user.

Specifically, the control console HS may be used as a manual input type setting device for variably setting the set unit amount Lx as the set amount, thereby to variably set the set unit amount Lx.

[Other Embodiments]

(1) In the foregoing embodiment, as an example of the support portion for supporting the container 50, there was disclosed the storage section 10S of the storage shelf 10. Instead, the present invention is applicable also to various support portions, such as a support portion for inactive gas introduction to be mounted to a substrate processing device or a support portion for storage provided on a lateral side of a guide rail G of the hoist type transport carriage D.

(2) In the foregoing embodiment, there was disclosed the exemplary arrangement wherein the feed rate of nitrogen gas is progressively increased also when the feed rate of nitrogen gas is to be increased from zero (feeding paused state) to the steady-state target feed rate. However, in the case of e.g. the steady-state target feed rate having a sufficiently low value, when the feed rate of nitrogen gas is to be increased from zero (feeding paused state) to the steady-state target feed rate, the feed rate of nitrogen gas may not be increased progressively, but may be increased at one (that is, instantaneously or in stepwise).

(3) In the foregoing embodiment, there was disclosed the exemplary arrangement in which in changing the feed rate of nitrogen gas to the container 50 from the initial target feed rate to the steady-state target feed rate, the feed rate of nitrogen gas is changed at once to the steady-state target feed rate. Instead, this may be decreased progressively.

Similarly, in the foregoing, there was disclosed the exemplary arrangement in which in changing the feed rate of nitrogen gas from the steady-state target feed rate to zero (feeding paused state), the feed rate of nitrogen gas is changed at once to zero (feeding paused state). Instead, this may be decreased progressively.

(4) In the foregoing embodiment, there was disclosed the exemplary arrangement using nitrogen gas as an inactive gas. However, as the inactive gas, various kinds of gas such as argon can be used. Incidentally, it is required for the inactive gas used in the present invention that the gas have a low oxygen content and a low absolute humidity.

(5) In the foregoing embodiment, there was disclosed the exemplary arrangement in which in progressively increasing the feed rate of nitrogen gas to the container 50, the feed rate of nitrogen gas is increased by the set unit amount Lx as a set amount, upon each lapse of the set unit period Tx as the set wait period. Instead, the invention may be embodied with continuously increasing the feed rate of nitrogen gas.

(6) In the foregoing embodiment, there was disclosed the exemplary arrangement in which the introducing device N includes, as the principal components thereof, the discharge nozzle 10i and the mass flow controller 40 having an internal control unit. Instead, the invention may be embodied with an arrangement wherein the feed passage of nitrogen gas incorporates a feed rate adjusting valve for variably adjusting the feed rate of nitrogen gas to the container 50 and a feed rate sensor for determining the feed rate of nitrogen gas to the container 50, such that the controller H controls the operation of the feed rate adjusting valve based on detection information from the feed rate sensor.

In this case, the introducing device N will be constituted of the discharge nozzle 10i and the feed rate adjusting valve as its principal components.

(7) In the foregoing embodiment, there were disclosed the four storage purge patterns P3-P6 as examples. Instead, as the storage purge pattern, various patterns can be used such as a pattern for feeding inactive gas intermittently at the initial target feed rate.

DESCRIPTION OF REFERENCE MARKS/NUMERALS

10 storage shelf
10S support portion 50 container
50i gas feed opening
50o gas discharge opening
H controller
HS setting device
N introducing device
Tx set wait period
Lx set amount
W substrate

The invention claimed is:

1. An inactive gas introducing facility comprising:
an introducing device disposed in a support portion for supporting a container for accommodating a substrate and configured for introducing inactive gas to the inside of the container through a gas feed opening of the container while allowing gas present inside the container to be discharged to an outside through a gas discharge opening of the container wherein the support portion is a storage section of a storage shelf for storing the container; and
a controller for controlling operation of the introducing device;
wherein the introducing device is capable of varying the feed rate of the inactive gas;
wherein the controller is configured to control operation of the introducing device to adjust the feed rate to an initial target feed rate which is predetermined, and subsequently to adjust the feed rate to a steady-state target feed rate which is predetermined and is less than the initial target feed rate, when supplying the inactive gas to the container supported by the support portion, and is configured to control operation of the introducing device to progressively increase the feed rate to the initial target feed rate when adjusting the feed rate to the initial target feed rate, and
wherein the controller is configured to control the operation of the introducing device so as to supply the inactive gas for a predetermined pre-storage feed period at a predetermined nozzle cleaning target feed rate in response to the controller receiving, before the container is supported by the support portion, a signal indicating that the container has been carried into a carry-in-and-out conveyor of the storage shelf.

2. The inactive gas introducing facility according to claim 1, wherein when the feed rate is changed from the initial target feed rate to the steady-state target feed rate, the operation of the introducing device is controlled by the controller such that the feed rate is decreased at a higher rate of change than the rate of change of the feed rate at the time of progressive increase of the feed rate to the initial target feed rate.

3. The inactive gas introducing facility according to claim 1, wherein:
after the controller changes the feed rate from the initial target feed rate to the steady-state target feed rate, the controller controls the operation of the introducing device so as to repeat a cycle of waiting for lapse of a set feed period and then pausing the feeding of the inactive gas for a set pause period after lapse of the set feed period; and
in adjusting the feed rate to the steady-state target feed rate after lapse of the set pause period, the controller controls the operation of the introducing device so as to progressively increase the feed rate toward the steady-state target feed rate.

4. The inactive gas introducing facility according to claim 1, wherein:
when the controller progressively increases the feed rate, the controller controls the operation of the introducing device such that the feed rate is increased by a positive-integer-multiple of a set amount upon each lapse of a set wait period.

5. The inactive gas introducing facility according to claim 4, further comprising a manual operation type setting device for changing the set amount.

6. The inactive gas introducing facility according to claim 1, wherein the steady-state target feed rate is less than 1/2 of the initial target feed rate.

7. The inactive gas introducing facility according to claim 1, further comprising:
a load presence sensor for detecting whether the container is supported on the support portion,
wherein the controller is configured to control operation of the introducing device such that the feeding of the inactive gas at, at least, the steady-state target feed rate is repeated at least intermittently, after adjusting the feed rate to the steady-state feed rate and while the load presence sensor detects the presence of the container.

8. An article storage facility having the inactive gas introducing facility according to claim 1, comprising:
the carry-in-and-out conveyor which is provided to the storage shelf for receiving the container being carried into the storage shelf and which is provided separately from the support portion;
a transport carriage configured to transfer the container to the carry-in-and-out conveyor in order to carry the container into the storage shelf from outside the storage shelf; and
a transport device for transporting the container, that has been transported to the carry-in-and-out conveyor by the transport carriage, to the support portion,
wherein the signal is transmitted to the controller when the container is delivered to the carry-in-and-out conveyor of the storage shelf by the transport carriage.

9. An inactive gas introducing method utilizing an inactive gas introducing facility,
wherein the inactive gas introducing facility includes:
an introducing device disposed in a support portion for supporting a container for accommodating a substrate and configured for introducing inactive gas to the inside of the container through a gas feed opening of the container while allowing gas present inside the container to be discharged to an outside through a gas discharge opening of the container wherein the support portion is a storage section of a storage shelf for storing the container, and
a controller for controlling operation of the introducing device, the introducing device being capable of varying a feed rate of the inactive gas in response to a feed rate command issued by the controller,
the method comprising the following steps that are effected by the controller:
a feed rate adjusting step in which, when feeding the inactive gas to the container supported by the storage section, a feed rate progressively increasing step is performed to issue a feed rate command to the introducing device to progressively increase the feed rate to an initial target feed rate which is predetermined, and in which the feed rate is adjusted to a steady-state target feed rate which is predetermined and is less than the initial target feed rate, after the feed rate is adjusted to the initial target feed rate by the feed rate progressively increasing step; and a nozzle purging step which is performed in response to the controller receiving a signal before the container is supported by the support portion, and in which the operation of the introducing device is controlled so as to supply the inactive gas for a predetermined pre-storage feed period at a predetermined nozzle cleaning target feed rate, wherein the signal indicates that the container has been carried into a carry-in-and-out conveyor of the storage shelf.

10. The inactive gas introducing method according to claim 9, wherein at the feed rate adjusting step, when the feed rate is changed from the initial target feed rate to the steady-state target feed rate, a feed rate command is issued to the introducing device for decreasing the feed rate at a higher change rate than the change rate of the feed rate at the time of progressive increase of the feed rate to the initial target feed rate at the feed rate progressively increasing step.

11. The inactive gas introducing method according to claim 9, wherein:
at the feed rate adjusting step, after the feed rate is changed from the initial target feed rate to the steady-state target feed rate, an intermittent feed step is performed for repeating a cycle of waiting for lapse of a set feed period and then pausing the feeding of the inactive gas for a set pause period upon lapse of the set feed period; and
at the intermittent feed step, in adjusting the feed rate to the steady-state target feed rate after lapse of the set pause period, the feed rate is progressively increased to the steady-state target feed rate.

12. The inactive gas introducing method according to claim 9, wherein at the feed rate progressively increasing step, a feed rate command is issued to the introducing device for increasing the feed rate by a positive-integer-multiple of a set amount upon each lapse of a set wait period.

13. The inactive gas introducing method according to claim 12, wherein the inactive gas introducing facility further comprises a manual operation type setting device for variably setting the set amount.

14. The inactive gas introducing method according to claim 9, wherein the steady-state target feed rate is less than 1/2 of the initial target feed.

15. The inactive gas introducing method according to claim 9, wherein
the inactive gas introducing facility further comprises a load presence sensor for detecting whether the container is supported on the support portion,
wherein the inactive gas introducing method includes a step of controlling the feed rate such that the feeding of the inactive gas at, at least, the steady-state target feed rate is repeated at least intermittently, after the feed rate adjusting step and while the load presence sensor detects the presence of the container.

16. The inactive gas introducing method according to claim 9, wherein the signal is transmitted to the controller when the container is delivered to the carry-in-and-out conveyor provided to the storage shelf separately from the support portion.

* * * * *